(12) United States Patent
Shanahan

(10) Patent No.: US 11,456,583 B2
(45) Date of Patent: Sep. 27, 2022

(54) JUNCTION BOX LID AND A JUNCTION BOX INCORPORATING THE LID

(71) Applicant: Woodside Energy Technologies Pty Ltd, Perth (AU)

(72) Inventor: Darren Shanahan, Subiaco (AU)

(73) Assignee: Woodside Energy Technologies Pty Ltd, Perth (AU)

( * ) Notice: Subject to any disclaimer, the term of this patent is extended or adjusted under 35 U.S.C. 154(b) by 0 days.

(21) Appl. No.: 17/543,881

(22) Filed: Dec. 7, 2021

(65) Prior Publication Data

US 2022/0239083 A1 Jul. 28, 2022

Related U.S. Application Data

(63) Continuation of application No. PCT/AU2020/050598, filed on Jun. 12, 2020.

(30) Foreign Application Priority Data

Jun. 12, 2019 (AU) ................................ 2019902042

(51) Int. Cl.
*H02G 3/08* (2006.01)
*G01K 11/12* (2021.01)

(52) U.S. Cl.
CPC ............ *H02G 3/081* (2013.01); *G01K 11/12* (2013.01); *H02G 3/088* (2013.01)

(58) Field of Classification Search
CPC .......... H02G 3/081; H02G 3/088; H02G 3/14; H02B 1/38; H02B 1/44; H02B 1/26;
(Continued)

(56) References Cited

U.S. PATENT DOCUMENTS 7,109,419 B1 * 9/2006 Gretz ................... H02G 3/12
174/67
8,476,540 B2 * 7/2013 Dahl ................... H02G 3/088
439/369

(Continued)

FOREIGN PATENT DOCUMENTS

AU 2014201652 A1 10/2014
GB 1597268 A 9/1981
GB 2293493 A * 3/1996 ............... H02B 1/44

OTHER PUBLICATIONS

International Search Report and Written Opinion, PCT/AU2020/050598, dated Jul. 13, 2020, 9 pages.
(Continued)

*Primary Examiner* — Angel R Estrada
(74) *Attorney, Agent, or Firm* — Edell, Shapiro & Finnan, LLC

(57) ABSTRACT

A lid for a junction box includes a structure which is arranged to connect and seal an opening of the junction box. The sealing prevents the ingress of foreign matter such as liquids or solid particles into the junction box. The structure is, or includes, a window that is transparent to visible light to enable visual inspection inside the junction box. The lid includes a cover that is opaque to UV or UV-IR wavelengths and is arranged to selectively: (a) shield the transparent portion of the structure from direct impingement of a wavelength or a band of wavelengths to prevent transmission of the wavelength or a band of wavelengths into the junction box; and (b) enable visual inspection inside of the junction box through the transparent portion.

11 Claims, 3 Drawing Sheets

(58) Field of Classification Search
CPC . H02B 1/528; H02B 1/30; H02B 1/06; G01K 11/12; H01R 13/52; H01R 13/46; H01R 13/5202; H01R 13/5205; H01R 13/5213; H01R 13/5219; H01R 13/53; H01R 13/533; H05K 5/00; H05K 5/02; H05K 5/0217; H05K 5/03; H05K 5/06
USPC ..... 174/50, 53, 57, 58, 66, 67, 520; 220/3.2, 220/3.3, 3.8, 4.02, 241, 242; 439/535, 439/536
See application file for complete search history.

(56) References Cited

U.S. PATENT DOCUMENTS

| | | | |
|---|---|---|---|
| 8,764,211 B2* | 7/2014 | Fredrickson | B60R 16/0239 174/535 |
| 8,796,548 B2* | 8/2014 | Rost | H05K 5/061 174/50 |
| 8,927,861 B2* | 1/2015 | Mahaney | H02B 1/00 174/50 |
| 10,742,010 B1* | 8/2020 | Baldwin | H02G 3/088 |
| 2008/0063026 A1 | 3/2008 | Roche | |

OTHER PUBLICATIONS

International Preliminary Report on Patentability Including Article 34 Amended Sheets, PCT/AU2020/050598, dated Jun. 1, 2021, 34 pages.

* cited by examiner

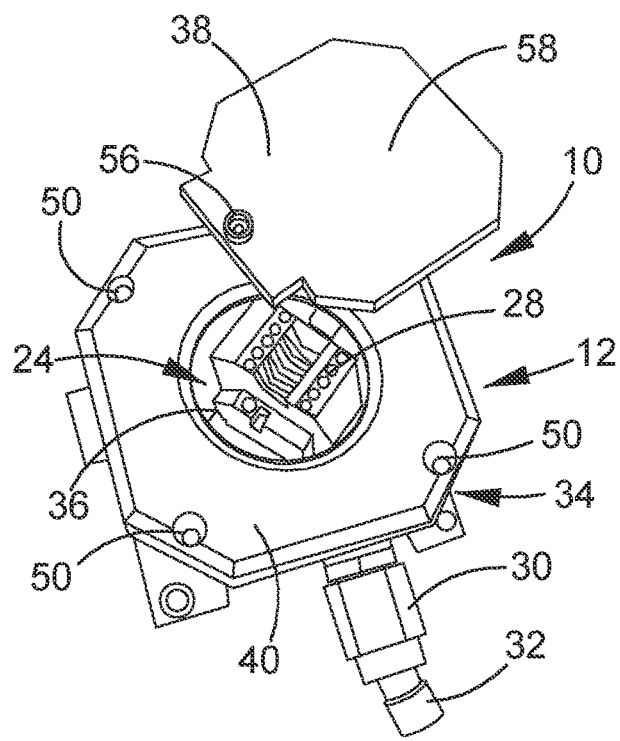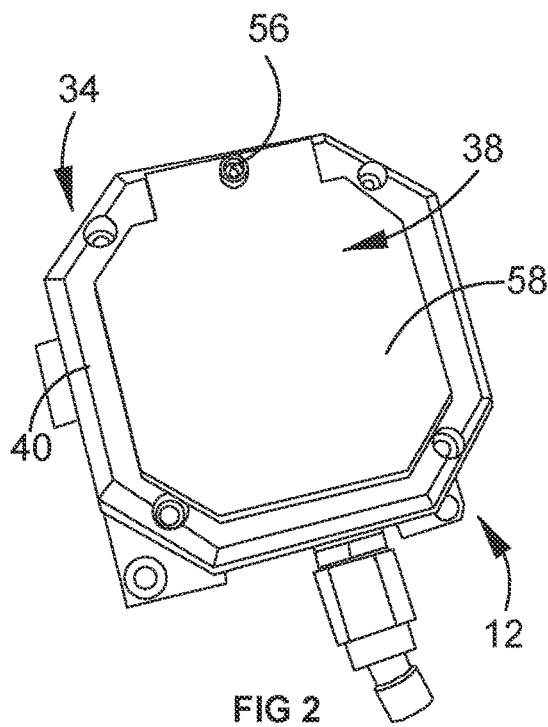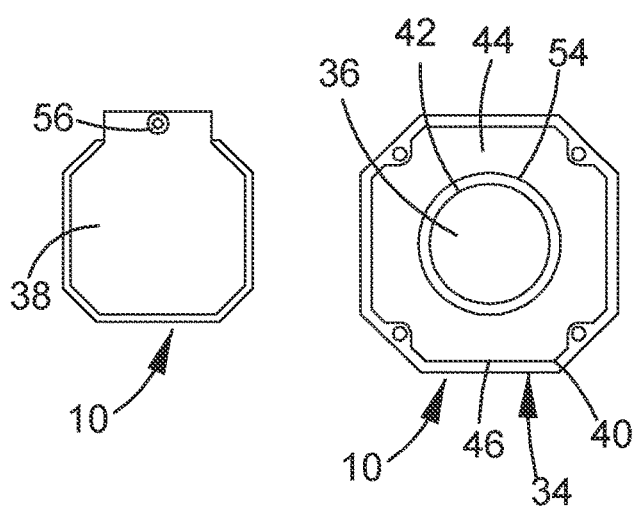
FIG 1
FIG 2
FIG 3

JUNCTION BOX LID AND A JUNCTION BOX INCORPORATING THE LID

CROSS-REFERENCE TO RELATED APPLICATIONS

This application is a continuation of International Application No. PCT/AU2020/050598, filed Jun. 12, 2020, which claims priority from AU 2019902042, filed Jun. 12, 2019, the disclosures of which are incorporated herein by reference in their entireties.

TECHNICAL FIELD

A junction box lid, and a junction box incorporating the lid are disclosed. The disclosed junction box lid and junction box are suited for use at outside locations, exposed to the environment.

BACKGROUND

A junction box is in the general form of a box having a lid that can be opened and closed for allowing access to the inside of the box for making electrical connections, as well as having openings through one or more of the box walls through which electrical cables or wires can pass. One or more connection blocks may be mounted inside the junction box for providing electrical connection between the cables terminating in the box.

When a junction box is located in an outside environment exposed to the elements it is important that the box provides a degree of ingress protection against liquids and solid particles such as water and dust. If the junction box is not adequately sealed liquid and/or dust can enter the box between mating surfaces of the lid on the box, or about the openings through which the cables pass.

For the purposes of compliance with safety and environmental regulations a junction box may need to meet a prescribed ingress protection (IP) rating. The rating is designated as IP XY where X is an integer between 0 and 6 providing an indication of solids ingress protection, and Y is an integer between 0 and 8 providing an indication of liquids ingress protection. As an example, the junction box may require an IP rating of IP X8. For a junction box to meet this rating it must be able to endure a 30-minute period under 1 m of water without ingress of water.

The ingress of liquid or dust into a junction box may cause shorting of electrical connections and/or fires. This may occur in a single weather event, or over a period of time where levels of liquid or dust progressively increase.

To minimise the likelihood of electrical shorting it is common for operators of facilities which have many environmentally exposed junction boxes to conduct scheduled preventative maintenance. This may involve for example junction boxes to be visually inspected from the outside every year or few years. Any junction box with a sign of liquid or dust ingress is inspected together with a random number of other junction boxes.

This involves a significant operational expense due the cost of people doing the maintenance, but more so for the need to shut down and electrically isolate the junction boxes prior to opening for safety reasons. This means that equipment which receives power and/or control signals via the opened junction boxes need to be shut down. This can adversely affect the production of the facility leading to substantially loss in revenue and profit that can be several orders of magnitude greater than the labour cost of the maintenance programme.

The above references are not intended to limit the application of the split assembly, method of fitting a washer assembly as disclosed herein.

SUMMARY

In one aspect there is disclosed a lid for a junction box the junction box having one or more walls defining a cavity and an opening, wherein the lid comprises:

a structure arranged to connect to one or more walls to close and seal the opening to prevent ingress of foreign material, at least a portion of the structure being transparent to visible light to enable visual inspection inside the junction box; and a cover being opaque to at least a wavelength or a band of wavelengths of electromagnetic radiation and arranged to selectively: (a) shield the transparent portion of the structure from direct impingement of a wavelength or a band of wavelengths to prevent transmission of the wavelength or a band of wavelengths into the junction box; and (b) enable visual inspection inside of the junction box through the transparent portion.

In one embodiment the cover is arranged to selectively shield the transparent portion and enable visual inspection by being coupled to the structure or junction box in a manner wherein the cover is movable between a closed position where the cover overlies a corresponding transparent wall to prevent transmission of wavelength or band of wavelengths into the junction box and an opened position where the cover is displaced from the corresponding transparent wall to enable visual inspection inside of the junction box.

In one embodiment the wavelength or a band of wavelengths of electromagnetic radiation in relation to which the cover is opaque comprises wavelengths corresponding to UV radiation.

In one embodiment the wavelength or a band of wavelengths of electromagnetic radiation in relation to which the cover is opaque comprises wavelengths ranging from UV radiation to IR radiation, inclusive.

In one embodiment the cover is biased toward the closed position.

In one embodiment cover is pivotally coupled to the structure and gravity biased toward the closed position.

In a second aspect there is disclosed a junction box comprising:

one or more walls which together form a sealable enclosure wherein at least a portion of one of the walls is transparent to visible light to enable visual inspection inside the junction box, and the remaining walls are opaque to electromagnetic radiation in a wavelength band from UV to IR inclusive; and a cover coupled with the one or more walls, the cover being opaque to at least a wavelength or a band of wavelengths of electromagnetic radiation and arranged to selectively: (a) shield the transparent portion of the structure from direct impingement of a wavelength or a band of wavelengths to prevent transmission of the wavelength or a band of wavelengths into the junction box; and (b) enable visual inspection inside of the junction box through the transparent portion.

In one embodiment of the second aspect the cover is arranged to selectively shield the transparent portion and enable visual inspection by being coupled to the one or more walls in a manner wherein the cover is movable between a closed position where the cover overlies the at least the transparent portion to prevent transmission of wavelength or band of wavelengths into the junction box and an opened position where the cover is displaced from the at least the transparent portion to enable visual inspection inside of the junction box.

In one embodiment of the second aspect the wavelength or a band of wavelengths of electromagnetic radiation in relation to which the cover is opaque comprises wavelengths corresponding to UV radiation.

In one embodiment of the second aspect the wavelength or a band of wavelengths of electromagnetic radiation in relation to which the cover is opaque comprises wavelengths ranging from UV radiation to IR radiation, inclusive.

In one embodiment of the second aspect the cover is biased toward the closed position.

In one embodiment of the second aspect the cover is pivotally coupled to the structure and gravity biased toward the closed position.

In one embodiment of the second aspect the junction box further comprises at least one thermo-chromatic indicator located inside of the junction box and arranged to provide a visual indication of temperature within the junction box being greater than a threshold temperature.

In a third aspect there is disclosed a junction box comprising:
one or more walls defining a cavity and an opening; and a lid according to the first aspect demountably connected to the one or more walls to cover and seal the opening.

In a fourth aspect there is disclosed a lid for a junction box the junction box having one or more walls defining a cavity and an opening, wherein the lid comprises:
a structure arranged to mechanically connect to one or more of the other walls to close the opening, the at least a portion of the structure being transparent to visible light to enable visual inspection inside the junction box; and
a cover dimensioned to enable the cover to the wholly overlie the transparent portion of the structure, the cover being opaque to at least UV electromagnetic radiation, and arranged to be movable between a closed position where the cover overlies the transparent portion to prevent transmission of UV radiation into the junction box and an opened position where the cover is displaced from the transparent portion to enable visual inspection inside of the junction box.

In a fifth aspect there is disclosed a junction box comprising:
a plurality of walls which together form a sealable enclosure wherein at least one of the walls, or has a potion thereof, is transparent to visible light to enable visual inspection inside the junction box, and the remaining walls are opaque to electromagnetic radiation in the wavelength band from UV to IR inclusive; and
a cover for each transparent wall or transparent wall portion, each cover being opaque to at least UV electromagnetic radiation and arranged to be movable between a closed position where the cover overlies a corresponding transparent wall to prevent transmission of UV radiation into the junction box and an opened position where the cover is displaced from the corresponding transparent wall to enable visual inspection inside of the junction box.

BRIEF DESCRIPTION OF THE DRAWINGS

Notwithstanding any other forms which may fall within the scope of the cover and junction box as set forth in the Summary, specific embodiments will now be described by way of example only with reference to the accompanying drawings in which:

FIG. 1 shows a prototype of an embodiment of the disclosed lid and junction box with a cover of the lid shown in an opened position allowing visualisation of the inside of the junction box through a window;

FIG. 2 shows the prototype of FIG. 1 but with the cover of the lid in a closed position preventing the impingement of selected wavelengths of electromagnetic radiation onto the window;

FIG. 3 shows the lead and junction box of FIGS. 1 and 2 in a partially disassembled state;

DETAILED DESCRIPTION

Figure 4:
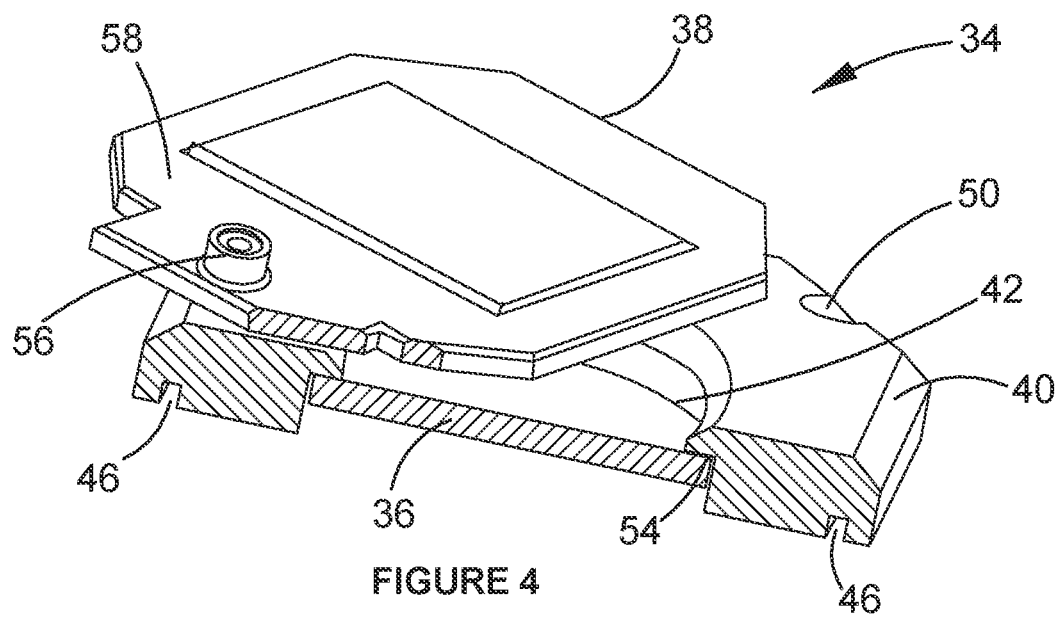
FIG. 4 is a cross-section view through an embodiment of the disclosed lid.

A lid for a junction box comprises a structure which is arranged to connect to and seal an opening of the junction box. The sealing prevents the ingress of foreign matter such as liquids or solid particles into the junction box. The structure is, or includes, a window that is transparent to visible light to enable visual inspection inside the junction box. The lid includes a cover that is opaque to UV or UV-IR wavelengths and is arranged to selectively: (a) shield the transparent portion of the structure from direct impingement of a wavelength or a band of wavelengths to prevent transmission of the wavelength or a band of wavelengths into the junction box; and (b) enable visual inspection inside of the junction box through the transparent portion.

The selective shielding is by virtue of the cover being movably coupled to the structure or the junction box so that the cover can be moved between a closed position where the cover overlies the window to prevent transmission of the wavelength or band of wavelengths of electromagnetic radiation into the junction box and an opened position where the cover is displaced from the window which allows visual inspection inside of the junction box.

FIGS. 1, 2 and 3 show a 3-D printed prototype of an embodiment of the disclosed lid 10 and associated junction box 12 to which the lid 10 is fitted. The lid 10 may also be considered as forming a removable wall of the junction box 12.

The junction box 12 in this embodiment is formed with a plurality of side walls 14, 16, 18 and 20; and, a bottom wall 22. The walls 14-22 define a cavity 24 and an opening 26. The lid 10 is arranged to connect to one or more the walls 14-22 to close and seal the opening 26.

The junction box 12 is shown with a connection block 28 fixed to the bottom wall 22 inside the cavity 24. A cable gland 30 is also shown attached to the wall 18 of the junction box 12. A cable 32 having a plurality of conductors passes through the cable gland 30 and can be connected to the connection block 28.

In more detail the lid 10 in is embodiment comprises a structure 34 which is arranged to connect to one or more of the walls 14-22 to close and seal the opening 24 with at least a portion or window 36 of the structure 34 being transparent to visible light to enable visual inspection inside the junction box 12. The lid 10 has a cover 38 that is opaque to at least a wavelength or a band of wavelengths of electromagnetic radiation and arranged to selectively: (a) shield the transparent portion of the structure from direct impingement of a wavelength or a band of wavelengths to prevent transmission of the wavelength or a band of wavelengths into the junction box; and (b) enable visual inspection inside of the junction box through the transparent portion.

In this embodiment the cover 38 is able to selectively shield the transparent portion and enable visual inspection by virtue of it being movably coupled to the structure 34 or the junction box 12. More particularly the cover 38 is movable between a closed position where the cover overlies the window 36 to prevent transmission of the wavelength or band of wavelengths of electromagnetic radiation into the junction box 12 and an opened position where the cover 38 is displaced from the window 36 to allows visual inspection inside of the junction box. In some embodiments the wavelength or band of wavelengths corresponds to wavelengths of UV radiation, although in other embodiments the band of wavelengths is that from UV to IR wavelength inclusive.

In this embodiment the structure 34 is in the general form of a plate 40 made from UV-IR opaque material and having an inboard hole 42. A side 44 of the plate 40 which faces the inside of the junction box 12 is formed with an endless groove 46, (see also FIG. 4 which shows a representation of the structure 34 in cross-section). The groove 46 is designed to receive a corresponding ridge 48 extends about the opening 24. A plurality of through holes 50 is formed in the plate 40 on the outside of the groove 46 for receiving screws (not shown). The screws mate with threaded holes 52 in the junction box 12 formed about the opening 24 for fastening the structure 34/plate 40 over the opening 24.

The hole 42 is formed with a circumferential shoulder 54 from the side 44. The window 36 which is transparent to visible light is seated, and sealed, in the shoulder 54. The window 36 may be made from various materials including but not limited to borosilicate or a transparent polycarbonate.

In one embodiment of the cover 38 may be biased toward the closed position. One way of achieving this is to pivotally couple the cover 38 to the plate 40. Provided the pivot is located vertically above the centre of gravity of the cover 38, the cover 38 will be gravity biased toward the closed position. To this end the cover 38 may be weighted to assist the gravity biasing. This can be achieved for example by moulding a piece of metal within the body of the cover 38 at a location on a side of its geometric centre opposite the pivot coupling.

The pivot coupling can be constructed by moulding or otherwise coupling an upright pin or spigot (not shown) extending from an outward face of the structure 34/plate 40 and forming a sleeve 56 on and through the cover 38 that receives the pin or spigot. The sleeve 56 extends perpendicular from each side of the cover 38. A portion of the sleeve 56 that extends from a front side 58 can be retained on the pin or spigot by a fastener such as a screw, bolt or a nut. In one example the pin or spigot may be formed with a transverse hole at location beyond the end of the sleeve 56 on the front side 58 for receiving a cotter pin, clip, or tie to thereby retain the cover 38 on the structure 34. In another embodiment the pin or spigot may be formed with a circumferential groove for receiving a circlip.

Embodiments of the lid 10 may be retrofitted to existing deployed junction boxes 12. In order to ensure ingress protection, a retrofitted lid 10 is constructed in a manner so that its screw holes 50 and continuous groove 46 match the location of the screw holes 52 and ridge 48 of the junction box to which they are to be retrofitted.

The structure 34 (i.e. both the cover 38 and the plate 40) may be made from various materials including metals or synthetic materials. However, when the junction box 10 is required to have an EX certification (i.e. for use in an explosive environment) it is envisaged that the structure 34 will be made from synthetic materials including but not limited to: synthetic polymers including polycarbonates; and fibre reinforced plastics material such as glass fibre reinforced polyester.

The junction box 12 may be made from the same materials as the structure 34. However, to avoid uncontrolled influx of UV-IR radiation into the junction box 12 the materials from which the structure 34 and junction box 12 are made, save for the window 36, should be opaque to at least UV radiation, or more preferably electromagnetic radiation from any wavelength ban from UV to IR.

A junction box 12 incorporating an embodiment of the lid 10 is capable of achieving an IP rating of IP 68 by reason of a sealed connection between the lid 10 and the walls of the junction box 12 arising from at least the mating of the groove 46 and ridge 48; the location of the holes 50 and 52 on the outside of the groove 46 and the ridge 48 respectively; the sealing of the window 36 in the structure 34; and the formation of the pivot coupling between the cover 38 and the plate 40 in a manner in which the plate 40 is not penetrated all the way through its thickness.

Figure 5:
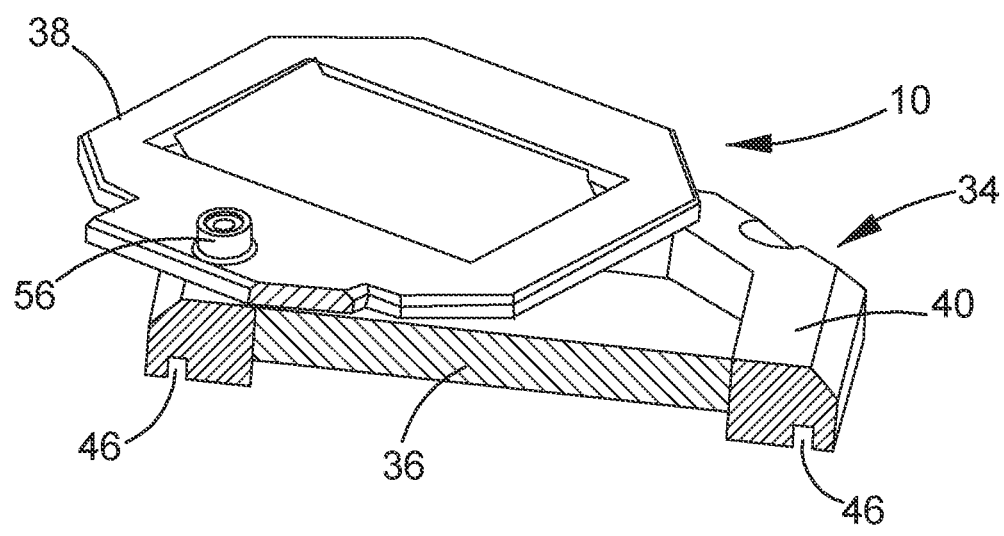
FIG. 5 the cross-section view through a second embodiment of the disclosed lid.

FIG. 5 depicts a second embodiment of the disclosed lid 10 which differs from that shown in FIGS. 1-4 primarily by way of the omission of the internal shoulder 54 in the plate 40 for seating the window 36.

Figure 6:
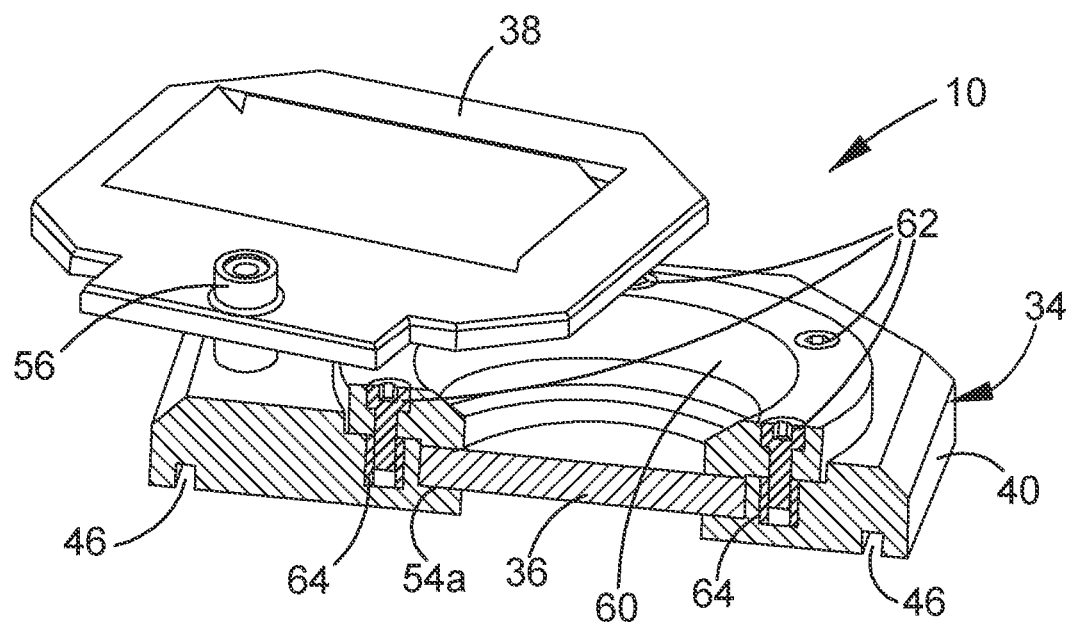
FIG. 6 is a cross-section view through a third embodiment of the disclosed lid.

FIG. 6 shows a cross-section view of a further embodiment of the disclosed lid 10 in which the window 36 is clamped between a shoulder 54a formed on the plate 40 (the shoulder 54a being in the reverse configuration to the shoulder 54) and a clamping ring 60. The clamping ring 60 is attached to the plate 40 away of screws 62 that are received in threaded cups 64 moulded into the plate 40. This form of lid 10 enables replacement of the window 36 without removing the plate 40.

Figure 7:
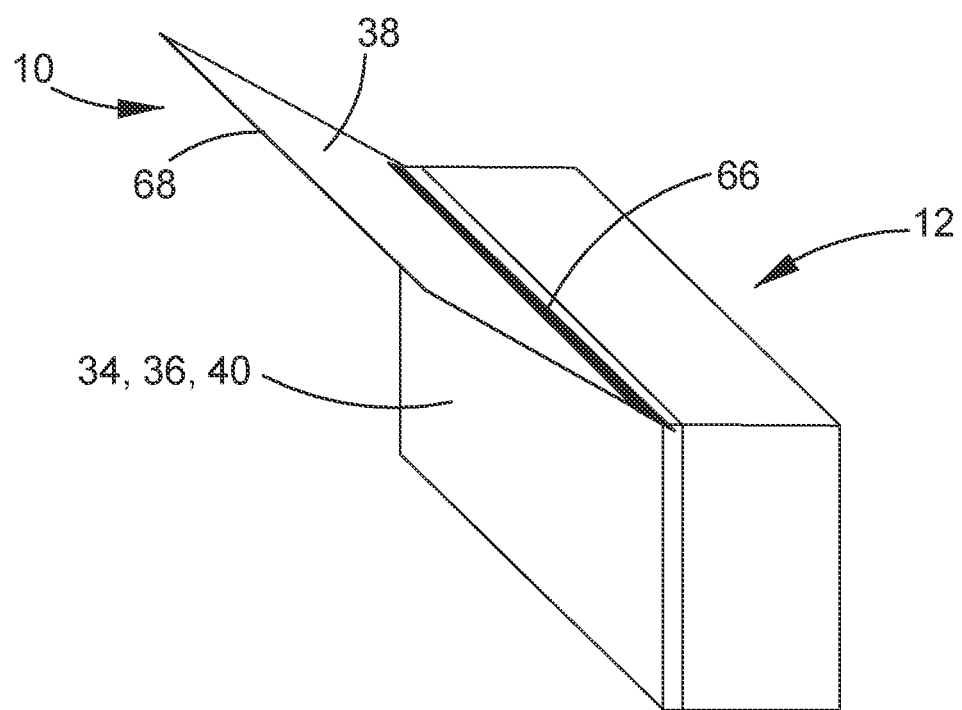
FIG. 7 is a schematic representation of a fourth embodiment of the disclosed lid fitted to a junction box.

In the embodiment shown in FIGS. 1-6 the cover 38 is depicted as one with a pivot coupling so that it can be swung or pivoted in a plane parallel to the plane of its surface and the plane of the plate 40. However, in alternate embodiments the cover 38 may be pivoted or hinged to swing for example through 180° from a lower vertical plane where it covers the window 36 to or towards an upper vertical plane where the inside of the junction box 12 can be visualised through the window 36. An example of this is depicted in FIG. 7 which shows a junction box 12 is in the general form of a rectangular box and the lid 10 comprising a rectangular window 36 that is fixed and sealed to side walls of the box 12, and a cover 38 in the form of a rectangular sheet of opaque material that is hinged to an upper edge of the window 36 or the junction box 12. In FIG. 7 the cover 38 is shown pivoted through an angle of about 110° from a lower vertical plane in which it would wholly overlies the window 36. A pivot pin or hinge 66 extends along one edge of the junction box 12 to pivotally couple the cover 38 to the structure 34/window 36 or another wall of the box 12.

In the embodiment of FIG. 7 the window 36, the plate 40, and the structure 34 are one and the same, so the window 36 is attached to the remainder of the junction box 12. However, in a variation more akin to the earlier embodiments the structure 34 may be formed of a separate plate and window that is attached to the plate for example in a manner similar to that shown in FIGS. 1-4 so that the structure 34 is attached to the junction box 12.

As with the earlier embodiment, the cover 38 is gravity biased toward the closed position. However, if desired this bias may be increased by for example: placing, including embedding, one or more weights near an edge 68 of the cover 38 opposite the pivot pin 66; or using an elastomeric pivot pin 66 to apply a torsional force in a direction to swing the cover 38 to the closed position where overlies the window 36.

In either embodiment a lock or latch may also be incorporated to restrain unintended motion of the cover 38 away from the window 36. One example of this may be the embedding of; magnets; or, a magnet and a ferromagnetic material inside the structure 34/plate 40 and the cover 38 which are located so as to magnetically engaged when the cover 38 is in the closed position. In an alternate example a slide bolt and an engagement loop can be used, one being on the cover 38 and the other at a location on the junction box. In this example when the cover 38 is in the closed position the slide bolt can be slid to a position where it engages with or is captured by the engagement loop. When the junction box is undergoing maintenance and it is desired to view the inside of the box through the window 36 slide bolt is slid away to disengage from the engagement loop and the cover 38 can be pivoted or swung away to enable visualisation through the window 36.

In some embodiments of the junction box 12 may also be fitted with thermo-chromatic sleeves, caps may be fitted to wires inside the box, or screws are other mechanical fasteners incorporated in the connection block 28. The thermo-chromatic sleeves have a material property such that they change when subjected to a temperature greater than a threshold temperature. The threshold object can for example be around 60° C.

The provision of the thermo-chromatic sleeve/cap may be used to give a visual indication of the temperature of a specific electrical connection or wire within the junction box 12. A change in colour may be indicative of the existence of a hotspot and therefore a fault requiring investigation.

Now that embodiments have been described, it should be appreciated that the junction box lid and junction box maybe embodied in other forms. For example, in each of the disclosed embodiments the wall or structure containing the window through which the interior of the junction box can be visualised is described as a removable wall or structure. However in alternate embodiments the transparent portion/window 36 may comprise a wall or be fixed to demountably coupled to a wall that is not removable from the walls of the junction box. In such an embodiment junction box is still provided with a cover having the same functionality as the cover 38 described above namely being able to be moved between a closed position where it shields the window from impingement of selected wavelengths of electromagnetic radiation (i.e. UV-IR wavelength) and an open position through which the interior of the junction box can be visualised. In such an embodiment in alternate wall of the junction box may be removable to enable access to the junction box for connecting or disconnecting electrical wires or cables. For example, with reference to the junction box shown in FIGS. 1-4 the bottom wall 22 may be a removable wall. In such an embodiment a connection block 28 may be arranged in a different orientation or attached to a different wall to enable physical access for connecting or disconnecting the electrical wires or cables. In a similar vein and with reference to FIG. 6, the window 36 may be formed as it only removable wall part of a wall of the junction box. This would involve for example the structure 40 shown in FIG. 6 being replaced by a portion of a wall of the junction box and formed with a shoulder 54a, for demountable and sealing the receiving the window 36. This may also involve a resizing of the window 36 to enable internal access to the inside of the junction box to enable the making or breaking of electrical connections.

Discussion of the background art throughout this specification should in no way be considered as an admission that such background art is prior art, nor that such background art is widely known or forms part of the common general knowledge in the field in Australia or worldwide.

In the claims which follow and in the preceding description, except where the context requires otherwise due to express language or necessary implication, the word "comprise" and variations such as "comprises" or "comprising" are used in an inclusive sense, i.e. to specify the presence of the stated features but not to preclude the presence or addition of further features of the embodiments as disclosed herein.

What is claimed is:

1. A junction box for use in an outside exposed environment comprising:
   a plurality of walls defining a cavity and an opening, the plurality of walls being opaque to at least UV radiation;
   a structure arranged to mechanically connect to one or more of the walls to close and seal the opening and the cavity, at least a portion of the structure being transparent to visible light to enable visual inspection inside the junction box;
   a cover for the at least a portion of the structure being transparent to visible light, the cover being opaque to at least UV electromagnetic radiation and arranged to be movable between a closed position where the cover overlies the at least a portion of the structure to prevent transmission of UV radiation into the junction box and an opened position where the cover is displaced from the at least a portion of the structure to enable visual inspection inside of the junction box; and
   a pivot coupling that couples the cover to the structure, the pivot coupling being located vertically above a centre of gravity of the cover wherein the cover is at least gravity biased toward the closed position.

2. The junction box according to claim 1 wherein the cover is provided with one or more weights to increase the bias of the cover toward the closed position.

3. The junction box according to claim 1 wherein the plurality of walls are opaque to wavelengths ranging from UV radiation to IR radiation, inclusive.

4. The junction box according to claim 1 wherein the cover is opaque to wavelengths ranging from UV radiation to IR radiation, inclusive.

5. The junction box according to claim 1 comprising a lock or latch to restrain unintended motion of the cover away from the closed position.

6. The junction box according to claim 1 wherein the plurality of walls and the structure are connected to provide the junction box with an ingress protection rating of IP 68.

7. The junction box according to claim 1 wherein the plurality of the walls and the structure are provided with complementary that ridges and grooves inboard of peripheral edges of the walls and the structure that mate with each other when the structure is connected to the walls to close and seal the cavity.

8. The junction box according to claim 7 wherein the pivot coupling between the structure and the cover is formed in a manner in which the structure is not penetrated all the way through its thickness.

9. The junction box according to claim 1 where the pivot coupling comprises a pivot pin extending perpendicular to a plane containing the cover.

10. The junction box according claim 1 where the pivot coupling comprises a pivot pin or hinge extending along one edge of the structure.

11. The junction box according claim 1 further comprising at least one thermo-chromatic indicator located inside of the junction box and arranged to provide a visual indication of temperature within the junction box being greater than a threshold temperature.

\* \* \* \* \*